US00RE47708E

(19) United States
(12) Reissued Patent
Noichi et al.

(10) Patent Number: US RE47,708 E
(45) Date of Reissued Patent: Nov. 5, 2019

(54) SEMICONDUCTOR DEVICE

(71) Applicant: NICHIA CORPORATION, Anan-shi, Tokushima (JP)

(72) Inventors: Takuya Noichi, Tokushima (JP); Yuichi Okada, Tokushima (JP)

(73) Assignee: NICHIA CORPORATION, Anan-shi, Tokushima (JP)

(21) Appl. No.: 14/852,684

(22) Filed: Sep. 14, 2015

Related U.S. Patent Documents

Reissue of:
(64) Patent No.: 8,779,567
Issued: Jul. 15, 2014
Appl. No.: 13/900,730
Filed: May 23, 2013

(30) Foreign Application Priority Data

May 24, 2012 (JP) ..... 2012-118542
Mar. 28, 2013 (JP) ..... 2013-070365

(51) Int. Cl.
*H01L 23/495* (2006.01)
*H01L 23/00* (2006.01)
(Continued)

(52) U.S. Cl.
CPC .... *H01L 21/4853* (2013.01); *H01L 23/49582* (2013.01); *H01L 23/49811* (2013.01);
(Continued)

(58) Field of Classification Search
CPC ..... H01L 23/49866; H01L 23/49582; H01L 23/49816; H01L 2924/01022;
(Continued)

(56) References Cited

U.S. PATENT DOCUMENTS 3,754,168 A * 8/1973 Cunningham ..... H01L 21/00 257/761
4,034,467 A * 7/1977 Sapunarow ..... H01L 24/81 174/257
(Continued)

FOREIGN PATENT DOCUMENTS

JP 64-011394 A 1/1989
JP 2000-150519 A * 5/2000
(Continued)

OTHER PUBLICATIONS

Machine translation of JP 2010-109044 A.*
(Continued)

*Primary Examiner* — James A Menefee
(74) *Attorney, Agent, or Firm* — Squire Patton Boggs (US) LLP

(57) ABSTRACT

In a semiconductor device including a semiconductor element and a wiring substrate on which the semiconductor element is mounted. The wiring substrate includes an insulating substrate and conductive wiring formed in the insulating substrate and electrically connected to the semiconductor element. The conductive wiring includes an underlying layer formed on the insulating substrate, a main conductive layer formed on the underlying layer, and an electrode layer covering side surfaces of the underlying layer and side surfaces and an upper surface of the main conductive layer. The underlying layer includes an adhesion layer being formed in contact with the insulating substrate and containing an alloy of Ti.

13 Claims, 7 Drawing Sheets

(51) Int. Cl.
*H01L 21/48* (2006.01)
*H01L 23/498* (2006.01)
*H01L 33/54* (2010.01)

(52) U.S. Cl.
CPC ..... *H01L 23/49827* (2013.01); *H01L 24/83* (2013.01); *H01L 33/54* (2013.01); *H01L 2224/131* (2013.01); *H01L 2224/16225* (2013.01); *H01L 2224/16227* (2013.01); *H01L 2224/83* (2013.01); *H01L 2924/12041* (2013.01); *H01L 2924/12042* (2013.01); *H01L 2924/15787* (2013.01)

(58) Field of Classification Search
CPC . H01L 2924/01042; H01L 2924/01074; H01L 24/13; H01L 24/81
See application file for complete search history.

(56) References Cited

U.S. PATENT DOCUMENTS 5,134,460 A * 7/1992 Brady ..... H01L 24/10 257/733
5,153,384 A * 10/1992 Iijima ..... H01L 21/481 174/257
5,442,235 A * 8/1995 Parrillo ..... H01L 23/5226 257/758
7,257,891 B2 * 8/2007 Lee ..... H05K 3/243 174/257
7,649,270 B2 * 1/2010 Higaki et al. ..... 257/790
9,105,628 B1 * 8/2015 Dubin ..... H01L 23/481
2004/0238961 A1 * 12/2004 Cunningham .... H01L 21/76805 257/758
2005/0017355 A1 * 1/2005 Chou ..... H01L 24/03 257/738
2007/0058059 A1 * 3/2007 Suehiro ..... 348/294
2008/0029780 A1 * 2/2008 Ohtsuka et al. ..... 257/99
2008/0043444 A1 * 2/2008 Hasegawa et al. ..... 361/717
2009/0233436 A1 * 9/2009 Kim et al. ..... 438/614
2010/0109159 A1 * 5/2010 Ho ..... H01L 24/11 257/737
2010/0200271 A1 * 8/2010 Arvin ..... B23K 35/0244 174/126.1
2011/0169034 A1 7/2011 Tseng et al.
2011/0291154 A1 * 12/2011 Noichi et al. ..... 257/99
2012/0086009 A1 * 4/2012 Shin ..... H01L 27/1288 257/59
2012/0162958 A1 * 6/2012 Rother ..... H01L 23/49582 361/813
2013/0049190 A1 * 2/2013 Topacio ..... H01L 24/05 257/737

FOREIGN PATENT DOCUMENTS

JP 2002-246744 A 8/2002
JP 2004-266168 A * 9/2004
JP 2006-041247 A 2/2006
JP 2007-096233 A 4/2007
JP 2007-103917 A * 4/2007
JP 2008-182050 A 8/2008
JP 2008-192949 * 8/2008
JP 2008-192949 A 8/2008
JP 2009-105409 A 5/2009
JP 2009-224751 A * 10/2009
JP 2010-109044 A 5/2010
JP 2012-060004 A 3/2012
WO 2010/092707 A1 * 8/2010
WO 2012/002580 A1 1/2012

OTHER PUBLICATIONS

Japanese Office Action and English Language Translation dated Feb. 14, 2017, issued in corresponding JP Application No. 2013-070365.

* cited by examiner

SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims priority of Japanese Patent Application No. 2012-118542, filed on May 24, 2012, and Japanese Patent Application No. 2013-070365, filed on Mar. 28, 2013. The entire contents of these applications are incorporated herein by reference.

BACKGROUND OF THE INVENTION

1. Field

The present invention relates to a semiconductor device, and a method for producing the semiconductor device.

2. Description of the Related Art

The wiring substrates on which one or more semiconductor elements are to be mounted are produced by arranging wiring of metallic material on one or more surfaces of an insulating substrate of, for example, a ceramic material. Generally, such wiring substrates can be produced by either a co-firing process or a post-firing process. According to the co-firing process, materials for wires are arranged before firing for producing the ceramic material. According to the post-firing process, wires are arranged after the firing for producing the ceramic material.

In many cases where a wiring substrate is produced by use of a ceramic substrate, a large collective substrate on which a number of semiconductor devices can be formed is produced in consideration of assemblability during a process of manufacturing the semiconductor devices. The post-firing process is used in many cases where wiring substrates are produced from a large collective substrate because the post-firing process is superior in precision in the patterning for wiring.

Electrodes can be formed by post-firing processes in two ways. In the first manner of electrode formation using a post-firing process, all the electrodes are formed by using a physical vapor deposition technique such as sputtering. For example, the ceramic wiring substrate disclosed in Japanese Patent Laid-Open No. H01-11394 has a wiring layer on a ceramic substrate, where the wiring layer is arranged by forming, on the ceramic substrate, a contact layer of titanium (Ti), a barrier layer of an alloy of Ti and tungsten (W), and a main conductive layer mainly constituted by copper (Cu), in this order by physical vapor deposition. The formation of the ceramic wiring substrate is completed by further arranging a noble metal layer of gold (Au), platinum (Pt), palladium (Pd), or the like for the purpose of antioxidation and improvement in solder wettability and wire bondability.

On the other hand, in the second manner of electrode formation using a post-firing process, an underlying layer for each electrode is formed by physical vapor deposition, and thereafter each electrode is formed by plating. In many cases, titanium (Ti) is used for forming an adhesion layer which constitutes the underlying layer and maintains adhesion to the ceramic substrate. In addition, in order to efficiently dissipate heat generated by the semiconductor elements, copper (Cu) is used as the plating metal in many cases. Further, formation of the wiring substrate of the above type is completed by growing a copper plating in positions in which electrodes are to be formed, removing portions of the underlying layer on which no electrode is to be formed and exposing the corresponding portions of the surface of the ceramic substrate and side surfaces of the underlying layer, and growing a plating of nickel (Ni), silver (Ag), gold (Au), or the like.

In the second manner of electrode formation using a post-firing process, the underlying layer the side faces of which are exposed after the growth of the Cu plating includes the adhesion layer for adhesion to the ceramic is formed of Ti. However, the plating of Ni, Ag, Au, or the like does not adhere to Ti. Even if the plating of Ni, Ag, Au, or the like adheres to the side surface of the Ti adhesion layer, part of the side surface of the Ti adhesion layer are still exposed or the plating of Ni, Ag, Au, or the like easily comes off. In other words, it is impossible to stably adhere the plating of Ni, Ag, Au, or the like to the side surfaces of the Ti adhesion layer. Therefore, gaps are produced between the plating of Ni, Ag, Au, or the like and the ceramic substrate. In addition, Ti is prone to be oxidized.

Further, generally, the semiconductor devices in which a semiconductor element is mounted on a wiring substrate are used in various environmental conditions. In particular, when the semiconductor devices in which a semiconductor element is mounted on a wiring substrate and a gap exists between the ceramic substrate and the plating are used in a high-temperature and high-humidity environment for a long time, the adhesion reliability is lowered. Specifically, in the high-temperature and high-humidity environment, water filtration into the gap between the ceramic substrate and the plating occurs, so that the film of titanium oxide becomes prone to corrosion. When the corrosion advances to a final stage, exfoliation occurs in the underlying layer under each electrode, so that the driving voltages of the above semiconductor devices become abnormal.

SUMMARY

According to one embodiment of the present invention, a semiconductor device comprising a semiconductor element and a wiring substrate on which the semiconductor element is mounted is provided. The wiring substrate includes an insulating substrate, and conductive wiring formed in the insulating substrate and electrically connected to the semiconductor element; the conductive wiring includes an underlying layer formed on the insulating substrate, a main conductive layer formed on the underlying layer, and an electrode layer covering side surfaces of the underlying layer and side surfaces and an upper surface of the main conductive layer; and the underlying layer includes an adhesion layer being formed in contact with the insulating substrate and the adhesion layer containing an alloy of one of W and Mo, the alloy contains Ti.

According to another embodiment of the present invention, a semiconductor device comprising a semiconductor element and a wiring substrate on which the semiconductor element is mounted is provided. The wiring substrate includes an insulating substrate, an upper-side conductive wiring which is formed on a surface on a first side of the insulating substrate and electrically connected to the semiconductor element, a back-side conductive wiring which is formed on a surface on a second side of the insulating substrate, and a vertically-through conductive wiring which is arranged inside the insulating substrate and electrically connects the upper-side conductive wiring and the back-side conductive wiring; each of the upper-side conductive wiring and the back-side conductive wiring includes an underlying layer formed on the insulating substrate, a main conductive layer being formed on the underlying layer and containing a conductive metal, and an electrode layer formed on an area extending from an upper surface of the main conductive layer to a surface of the insulating substrate to cover and side surfaces and the upper surface of the main conductive layer and side surfaces of the underlying layer; and the underlying layer includes an adhesion layer being formed in contact with the insulating substrate and containing TiW, and an auxiliary conductive layer being formed in contact with the main conductive layer and containing the conductive metal.

According to another embodiment of the present invention, a semiconductor device comprising a semiconductor element and a wiring substrate on which the semiconductor element is mounted is provided. The wiring substrate includes an insulating substrate and a conductive wiring formed in the insulating substrate and electrically connected to the semiconductor element; the conductive wiring includes an underlying layer formed on the insulating substrate, a main conductive layer formed on the underlying layer, and an electrode layer covering side surfaces of the underlying layer and side surfaces and an upper surface of the main conductive layer; and the underlying layer includes an adhesion layer being formed in contact with the insulating substrate and containing an alloy of Ti.

According to further embodiment of the present invention, a method for producing a semiconductor device is provided, where the semiconductor device includes a semiconductor element and a wiring substrate on which the semiconductor element is mounted. The method comprising: a first step of forming vertically-through conductive wiring through an insulating substrate by shaping of a raw material for the insulating substrate in such a manner that a through hole is formed through the shaped raw material, application of a metallic material to an inner surface of the through hole, and firing of the shaped raw material; a second step of forming an adhesion layer constituting an underlying layer over a region of the insulating substrate containing the vertically-through conductive wiring, on each of an upper side and a back-side of the insulating substrate, by physical vapor deposition of a material containing an alloy of Ti; a third step of forming a mask on an area of an upper surface of the underlying layer which is predetermined to contain at least an isolation line for electrically isolating electrodes in a pair from each other; a fourth step of forming a main conductive layer by plating with a material containing a conductive material, over the insulating substrate after the underlying layer and the mask are formed; a fifth step of removing the mask; a sixth step of etching an area of the underlying layer which is exposed in the fifth step until an area of the insulating substrate under the etched area of the underlying layer is exposed; and a seventh step of forming an electrode layer by plating with a material containing a metal for the electrodes, over the insulating substrate after the main conductive layer is formed, in such a manner that the electrode layer covers side surfaces of the underlying layer and side surfaces and an upper surface of the main conductive layer which are exposed in the sixth step.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
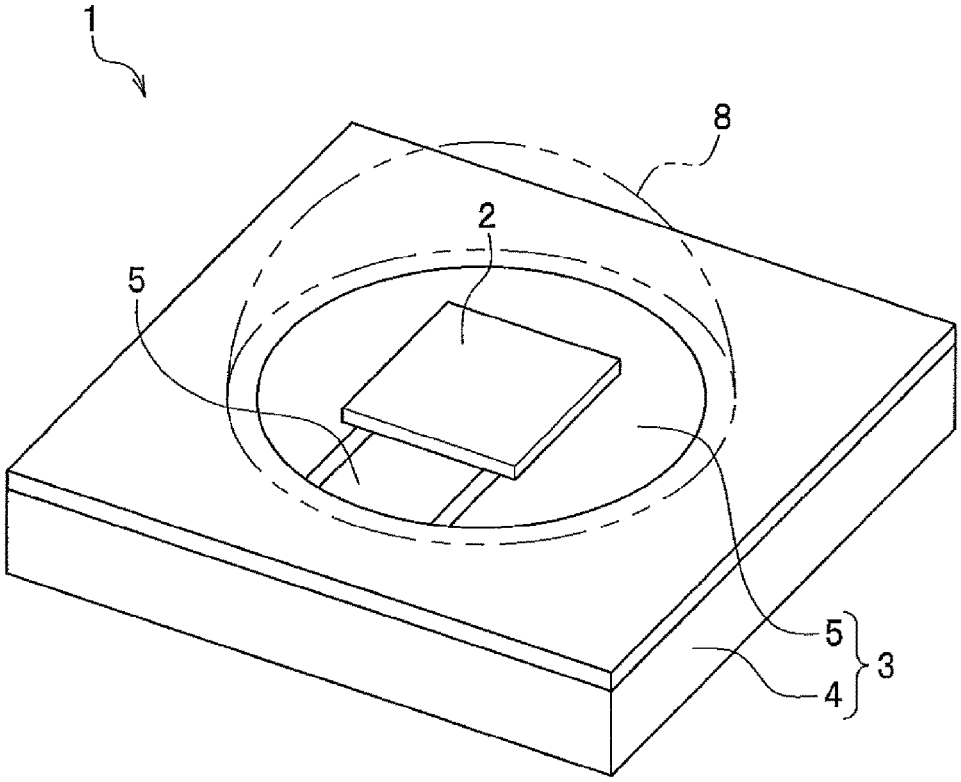
FIG. 1 is a perspective view schematically illustrating the top side of a semiconductor device according to an embodiment.

A semiconductor device as an embodiment of the present invention is explained below with reference to accompanying drawings, in which the dimensions and relative positions of the constituent elements may be exaggerated for clarifying the explanations. In addition, in the following explanations, identical or equivalent components or constituents are indicated by the same reference numbers, and identical explanations are not repeated unless necessary.

As mentioned previously, the semiconductor device according to the embodiment comprises the semiconductor element and the wiring substrate on which the semiconductor element is mounted, and the wiring substrate includes the insulating substrate and the conductive wiring. The conductive wiring includes the underlying layer, the main conductive layer, and the electrode layer. The underlying layer includes an adhesion layer being formed in contact with the insulating substrate and containing an alloy of Ti.

It is preferable that the alloy of Ti contain a group 6 (periodic table) transition metal element as a main component. If the adhesion layer is formed of titanium, oxygen in the main conductive layer moves to the adhesion layer due to a heat load imposed on the semiconductor device, and is combined with titanium to produce titanium oxide. On the other hand, the adhesion layer in the semiconductor device according to the embodiment contains an alloy of Ti (for example, the alloy of Ti containing a group 6 transition metal element as a main component). Therefore, the adhesion layer in the semiconductor device according to the embodiment is more resistant to oxidation than the conventional Ti adhesion layer.

In addition, if the adhesion layer is formed of titanium, titanium is likely to form an oxide film, which makes surface activation difficult. Therefore, adhesion of the plating becomes difficult. Thus, when the electrode layer is formed, the plating for the electrode layer cannot stably adhere to the side surfaces of the Ti adhesion layer, so that gaps are produced between the insulating substrate and the electrode layer. When water infiltrates into the gaps, the aforementioned titanium oxide corrodes, and can cause separation of the underlying layer.

On the other hand, the adhesion layer in the semiconductor device according to the embodiment contains an alloy of Ti (for example, the alloy of Ti containing a group 6 transition metal element as a main component). The alloy of Ti (for example, the alloy of Ti containing a group 6 transition metal element as a main component) is more resistant to oxidation and more unlikely to form an oxide film than Ti, so that the plating can adhere to the side surfaces of the adhesion layer formed of the alloy of Ti (for example, the alloy of Ti containing a group 6 transition metal element as a main component). That is, when the electrode layer is formed over the main conductive layer and the underlying layer including the above adhesion layer of the alloy of Ti, the plating for the electrode layer stably adheres to the side surfaces of the adhesion layer. Therefore, no gap is produced between the insulating substrate and the electrode layer, and the electrode layer behaves as a protection film for the side surfaces of the adhesion layer. Thus, even when the semiconductor device according to the embodiment is used in a high-temperature and high-humidity environment for a long time, the reliability of the electric connections in the conductive wiring can be increased compared with the conventional techniques.

The semiconductor device according to the embodiment includes the semiconductor element and the wiring substrate (on which the semiconductor element is mounted), and the wiring substrate includes the insulating substrate and the conductive wiring. The conductive wiring includes the underlying layer, the main conductive layer, and the electrode layer. The underlying layer includes the adhesion layer being formed in contact with the insulating substrate and containing an alloy of one of W and Mo, where the alloy contains Ti.

It is preferable that the underlying layer in the semiconductor device according to the embodiment further includes the auxiliary conductive layer formed in contact with the main conductive layer.

On the upper and bottom sides of the semiconductor device according to the embodiment having the auxiliary conductive layer, the electrode layer in each of the upper-side conductive wiring and the back-side conductive wiring completely covers the main conductive layer and the underlying layer. That is, the side surfaces of the adhesion layer, the side surfaces of the auxiliary conductive layer, the side surfaces of the main conductive layer, and the upper surface of the main conductive layer are coated with the electrode layer. The upper-side conductive wiring and the back-side conductive wiring are electrically connected through the vertically-through conductive wiring, which is arranged inside the insulating substrate.

The adhesion layer and the auxiliary conductive layer are formed by a vapor deposition technique such as sputtering after the firing of the insulating substrate, and the main conductive layer and the electrode layer are formed by plating. At this time, the main conductive layer is formed over the vertically-through conductive wiring through the underlying layer. Actually, a pair of main conductive layers are formed for each semiconductor device, and the two main conductive layers are insulated from each other. Therefore, before the plating for the pair of main conductive layers is performed, a mask is formed to prevent growth of the plating on the insulating region of the insulating substrate by which the pair of main conductive layers are insulated from each other. Further, when the unnecessary portion of the underlying layer located on the insulating region is removed after the formation of the main conductive layer and removal of the mask, the insulating region of the insulating substrate and the side surfaces of the adhesion layer and the auxiliary conductive layer on both sides of the insulating region are exposed. Thus, the exposed regions of the insulating substrate include the insulating region between each pair of main conductive layers as well as the regions in which the insulating substrate is to be cut when the collective wiring substrate is separated into the individual semiconductor devices.

If the adhesion layer is formed of titanium, oxygen in the main conductive layer moves to the adhesion layer due to a heat load imposed on the semiconductor device, and is combined with titanium to produce titanium oxide. On the other hand, the adhesion layer in the semiconductor device according to the embodiment contains an alloy of W or Mo, and the alloy contains Ti. Therefore, the adhesion layer in the semiconductor device according to the embodiment is resistant to oxidation.

In addition, if the adhesion layer is formed of titanium, titanium is likely to form an oxide film, which makes surface activation difficult. Therefore, adhesion of the plating becomes difficult. Thus, when the electrode layer is formed, the plating for the electrode layer cannot stably adhere to the side surfaces of the Ti adhesion layer, so that gaps are produced between the insulating substrate and the electrode layer. When water filtrates into the gaps, the aforementioned titanium oxide corrodes, and can cause separation of the underlying layer.

On the other hand, the adhesion layer in the semiconductor device according to the embodiment contains an alloy of W or Mo containing Ti. The alloy of W or Mo containing Ti is resistant to oxidation and unlikely to form an oxide film, so that the plating can adhere to the side surfaces of the adhesion layer. That is, when the electrode layer for the semiconductor device according to the embodiment is formed, the plating for the electrode layer stably adheres to the side surfaces of the adhesion layer. Therefore, no gap is produced between the insulating substrate and the electrode layer, and the electrode layer behaves as a protection film for the side surfaces of the adhesion layer. Thus, even when the semiconductor device according to the embodiment is used in a high-temperature and high-humidity environment for a long time, the reliability of the electric connections in the conductive wiring can be increased compared with the conventional techniques.

In certain embodiments, the semiconductor device further can have the following additional features (a) to (e).

(a) The main conductive layer in the semiconductor device can be formed of Cu.

(b) In the case where the underlying layer in the semiconductor device includes the auxiliary conductive layer as well as the adhesion layer, at least one of the main conductive layer and the auxiliary conductive layer can contain (or is formed of) Cu. Since the conductive wiring contains Cu, the heat dissipation performance of the semiconductor device can be improved.

(c) In the case where the underlying layer in the semiconductor device includes the auxiliary conductive layer as well as the adhesion layer, the main conductive layer can have a thickness greater than the auxiliary conductive layer. In this case, the thickness of the main conductive layer can be 20 to 80 micrometers, and the thickness of the auxiliary conductive layer can be 0.1 to 3 micrometers.

(d) The electrode layer in the semiconductor device can be Ni or Au.

(e) In the case where the adhesion layer in the semiconductor device contains an alloy of W containing Ti, the Ti composition of the alloy can be 1 to 30 weight percent.

In the semiconductor device according to the embodiment, the adhesion layer is formed of TiW. Therefore, the plating for the electrode layer adheres to the side surfaces of the adhesion layer when the electrode layer is formed. Thus, the reliability of the electric connections in the conductive wiring in the semiconductor device according to the embodiment can also be increased compared with the conventional techniques.

The semiconductor device according to the embodiment can further have the following additional features (a) to (c).

(a) The conductive metal contained in the main conductive layer in the semiconductor device can be Cu. Since the conductive wiring contains Cu in this case, the heat dissipation performance of the semiconductor device can be improved.

(b) The electrode layer in the semiconductor device can contain Ni and Au.

(c) TiW contained in the adhesion layer in the semiconductor device can contain 1 to 30 weight percent of Ti.

The method according to the embodiment can include the first to seventh steps.

The method can also have the following additional features (a) to (p).

(a) Multiple through holes are formed in the first step in the insulating substrate for multiple wiring substrates, the mask is formed in the third step on multiple areas of the upper surface of the underlying layer which respectively contain multiple cutting lines corresponding to edges between the multiple wiring substrates, and the method further includes an eighth step of forming the multiple wiring substrates by cutting the insulating substrate along the cutting lines after the electrode layer is formed in the seventh step.

(b) The method having the above feature (a) further includes, after the eighth step, a ninth step of bonding the semiconductor element to each of the multiple wiring substrates, and a tenth step of encapsulating, with an encapsulation member, the semiconductor element bonded to each of the multiple wiring substrates.

(c) The method having the above feature (b) further includes, between the ninth step and the tenth step, a step of bonding conductive wires to the semiconductor element.

(d) The method having the above feature (a) further includes, between the seventh step and the eighth step, a ninth step of bonding the semiconductor element to each of the multiple wiring substrates, and a tenth step of encapsulating, with an encapsulation member, the semiconductor element bonded to each of the multiple wiring substrates.

(e) The method having the above feature (d) further includes, between the ninth step and the tenth step, a step of bonding conductive wires to the semiconductor element.

(f) In the method the second step includes a step of forming on the adhesion layer an auxiliary conductive layer constituting the underlying layer by coating the adhesion layer with a material containing a conductive metal by physical vapor deposition.

(g) In the method having the above feature (f), the main conductive layer and the auxiliary conductive layer are formed of an identical material in the fourth step and the second step.

(h) In the method having the above feature (g), the main conductive layer and the auxiliary conductive layer contain Cu.

(i) In the method having the above feature (f), the main conductive layer is formed in the fourth step such that the main conductive layer is thicker than the auxiliary conductive layer.

(j) In the method having the above feature (i), the main conductive layer is formed in the fourth step to have a thickness of 20 to 80 micrometers.

(k) In the method having the above feature (i), the auxiliary conductive layer is formed in the second step to have a thickness of 0.1 to 3 micrometers.

(l) In the method, the main conductive layer formed in the fourth step contains Cu.

(m) In the method, the metal for the electrodes of which the electrode layer is formed in the seventh step is a material containing one of Ni and Au.

(n) In the method, the material containing the alloy of Ti of which the adhesion layer is formed in the second step contains as a main material a group VI metal element.

(o) In the method having the above feature (n), the adhesion layer is formed of a material containing an alloy of one of W and Mo which contains Ti.

(p) In the method having the above feature (o), the adhesion layer is formed of a material containing an alloy of W which contains 1 to 30 weight percent of Ti.

Figure 2:
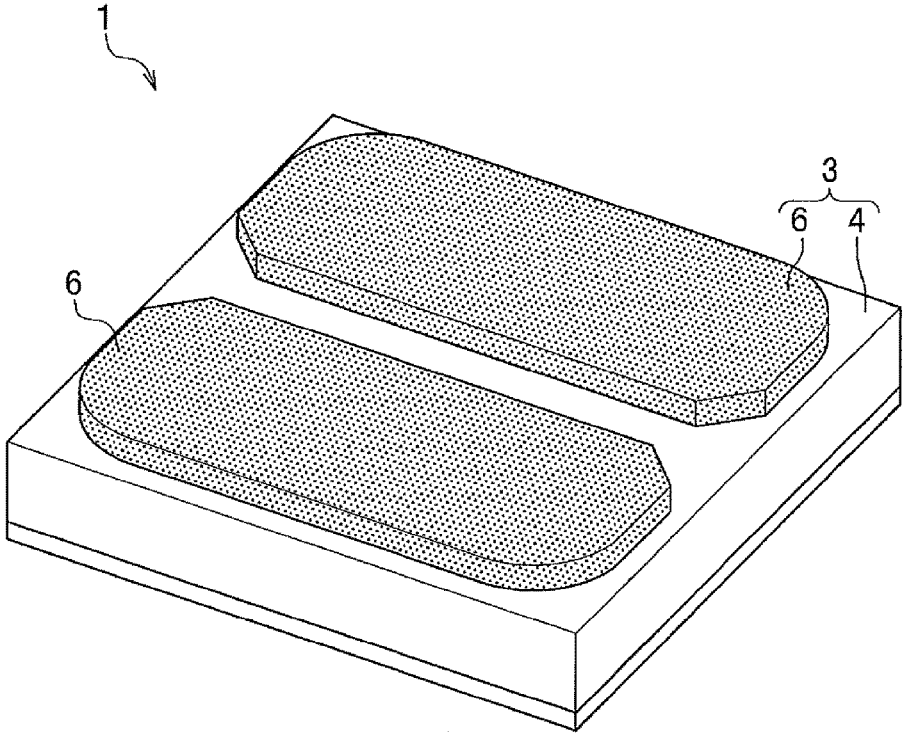
FIG. 2 is a perspective view schematically illustrating the back-side of the semiconductor device according to the embodiment.
Figure 3A:
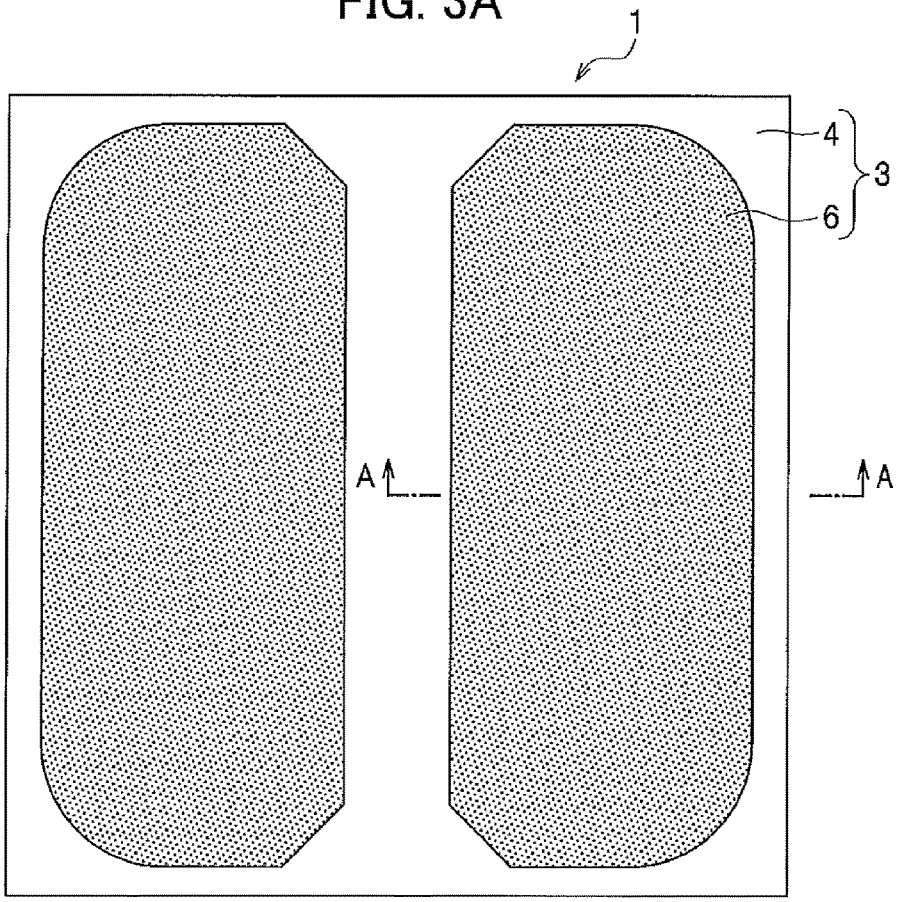
FIG. 3A is a bottom view schematically illustrating the back-side of the semiconductor device according to the embodiment.

<Outline of Structure> The outline of the structure of the semiconductor device 1 according to the present embodiment is explained below with reference to FIGS. 1 to 3B. FIG. 1 is a perspective view illustrating the top side of the semiconductor device 1. FIG. 2 is a perspective view illustrating the back-side of the semiconductor device 1. FIG. 3A is a bottom view illustrating the back-side of the semiconductor device 1. And FIG. 3B a partial cross-sectional view of the semiconductor device 1 in the A-A cross section indicated in FIG. 3A.

The semiconductor device 1 can include a semiconductor element 2 and a wiring substrate 3 on which the semiconductor element 2 is to be mounted. For example, the semiconductor element 2 is constituted by a semiconductor light-emitting element such as an LED (light-emitting diode) chip. The wiring substrate 3 is a part in which a mount on which the semiconductor element 2 is to be mounted, conductive wiring to be electrically connected to the semiconductor element 2, and electric terminals for connection to external terminals are arranged on an insulating substrate 4. That is, the wiring substrate 3 is constituted mainly by the insulating substrate 4 and the conductive wiring. Specifically, the conductive wiring includes conductive wiring 5 on the upper side (hereinafter referred to as the upper-side conductive wiring 5) and conductive wiring 6 on the back-side (hereinafter referred to as the back-side conductive wiring 6). The back-side conductive wiring 6 is illustrated as the halftone dot regions in FIGS. 2 and 3A. Further, the wiring substrate 3 also includes vertically-through conductive wiring 7.

The upper-side conductive wiring 5 is formed on the upper surface of the insulating substrate 4, and provided for the mounted semiconductor element 2. The upper-side conductive wiring 5 includes a pair of wires corresponding to a pair of electrodes of a semiconductor light-emitting device, which is face-down (FD) mounted on the wiring substrate 3, where the pair of wires are insulated from each other. Further, the pair of wires are electrically connected to a pair of wires in the back-side conductive wiring 6 through a pair of wires in the vertically-through conductive wiring 7. The vertically-through conductive wiring 7 electrically connects the upper-side conductive wiring 5 and the back-side conductive wiring 6. Preferably, the vertically-through conductive wiring 7 is formed of a metal having a high melting temperature such as tungsten (W) or the molybdenum (Mo). In addition, an encapsulation member 8 is arranged over the upper-side conductive wiring 5 to cover at least the semiconductor element 2.

The back-side conductive wiring 6 is formed on the back surface of the insulating substrate 4, and includes wiring to be connected to external electrodes. The back-side conductive wiring 6 includes the above-mentioned pair of wires in correspondence with the pair of electrodes of the semiconductor light-emitting device, where the pair of wires in the back-side conductive wiring 6 are insulated from each other. Further, the back-side conductive wiring 6 is electrically connected to the upper-side conductive wiring 5 through the vertically-through conductive wiring 7. Since the back-side conductive wiring 6 has a lamination structure similar to the upper-side conductive wiring 5, only the lamination structure of the back-side conductive wiring 6 is explained below. The back-side conductive wiring 6 includes a underlying layer 10, a main conductive layer 20, and an electrode layer 30.

The underlying layer 10 is formed on the insulating substrate 4 as a base for the main conductive layer 20, which is a thick film. The underlying layer 10 is formed over a region containing the vertically-through conductive wiring 7 in the insulating substrate 4. The underlying layer 10 is formed by physical vapor deposition such as sputtering after the firing of the insulating substrate 4. The process for forming the underlying layer 10 will be explained later in the explanations on a process for producing the wiring substrate 3.

The underlying layer 10 can include an adhesion layer 11 and an auxiliary conductive layer 12. The adhesion layer 11 is formed on the insulating substrate 4 in direct contact with the insulating substrate 4.

The present inventors have investigated, from various viewpoints, the aforementioned second manner of electrode formation by the post-fire process for production of the wiring substrate in the semiconductor device. As a result of the investigation, the present inventors have found that platings of an electrode material stably adhere to the side surfaces of an adhesion layer arranged for adhesion of the electrode to the insulating substrate when the adhesion layer is formed of an alloy of a group VI transition metal element (e.g., W or Mo) containing Ti. Therefore, in the present embodiment, the adhesion layer 11 is formed of an alloy of W or Mo containing Ti. For example, two titanium-based materials, titanium-tungsten (TiW) and titanium-molybdenum (TiMo), are as superior as Ti in adhesiveness to the ceramic, and are highly resistant to oxidation and corrosion in contrast to Ti.

In the following explanations on the present embodiment, the adhesion layer 11 is assumed to be formed of TiW. The compositions of tungsten (W) and titanium (Ti) constituting the TiW adhesion layer 11 are similar to the typical compositions in the TiW target, which is, for example, used in sputtering. Specifically, the TiW target containing, for example, 10 weight percent of Ti is commercially available. However, the compositions of tungsten (W) and titanium (Ti) constituting the TiW adhesion layer 11 are not limited to the above numerical value as long as the main component is W and the TiW adhesion layer 11 has such a Ti content as not to lower the adhesion performance. For example, a preferable range of the Ti content in the TiW adhesion layer 11 is 1 to 30 weight percent because the oxidation resistance can be improved in this range. The Ti composition in the above range can be appropriately determined on the basis of the adhesiveness between the material constituting the insulating substrate 4 and the material constituting the main conductive layer 20.

The auxiliary conductive layer 12 is formed on the upper side of the adhesion layer 11. The auxiliary conductive layer 12 is arranged in direct contact with the main conductive layer 20 to be a base for the main conductive layer 20. It is preferable that the auxiliary conductive layer 12 be formed of the same metal as the main conductive layer 20. In this case, after the auxiliary conductive layer 12 is formed by physical vapor deposition such as sputtering, a plating of the same material as the auxiliary conductive layer 12 can be grown on the auxiliary conductive layer 12 to be the main conductive layer 20. Therefore, the main conductive layer 20 can be formed to be a stable plating layer in the above case. (Hereinafter, the metal of which the main conductive layer 20 is formed is referred to as the main conductive metal.)

The main conductive layer 20 is formed (of the main conductive metal) on the underlying layer 10. The main conductive metal is, for example, copper (Cu), nickel (Ni), zinc (Zn), or chromium (Cr). In the present embodiment, the main conductive layer 20 is formed of Cu because Cu exhibits superior heat dissipation characteristics. Therefore, in the following explanations on the present embodiment, it is assumed that both of the auxiliary conductive layer 12 and the main conductive layer 20 are formed of Cu.

The main conductive layer 20 is formed over the areas of the insulating substrate 4 on which the underlying layer 10 is formed, and which are located in such positions that the main conductive layer 20 is connected to the vertically-through conductive wiring 7 through the underlying layer 10. Although both of the auxiliary conductive layer 12 and the main conductive layer 20 are formed of Cu in the present embodiment, the manners of formation of the auxiliary conductive layer 12 and the main conductive layer 20 are different, and therefore the thicknesses of the auxiliary conductive layer 12 and the main conductive layer 20 are greatly different. For example, the auxiliary conductive layer 12 is a sputtered film having a thickness of 0.1 to 3 micrometers and the main conductive layer 20 is a plating layer having a thickness of 20 to 80 micrometers. The manner of formation of the main conductive layer 20 will be explained later in the explanations on the process for producing the wiring substrate 3.

The electrode layer 30 covers the entire surfaces of the underlying layer 10 and the main conductive layer 20 on the insulating substrate 4. The electrode layer 30 is formed on an area extending from the upper surface of the main conductive layer 20 to the surface of the insulating substrate 4 to cover the side surfaces and the upper surface of the main conductive layer 20 and the side surfaces of the underlying layer 10.

The electrode layer 30 can be formed of a material chosen for preventing oxidation and improving the solder wettability and the wire bondability. Such a material may be, for example, gold (Au), silver (Ag), nickel (Ni), platinum (Pt), or palladium (Pd). In the present embodiment, the electrode layer 30 is assumed to contain nickel (Ni) and gold (Au) as an exemplary case. Specifically, the electrode layer 30 includes a Ni plating layer 31 and an Au plating layer 32 which is formed over the nickel plating layer 31. The manner of formation of the electrode layer 30 will be explained later in the explanations on the process for producing the wiring substrate 3.

Hereinbelow, the respective constituents of the semiconductor device 1 are explained in detail.

In the case where the semiconductor element 2 is a semiconductor light-emitting device, the semiconductor element 2 may have the aforementioned face-down mount structure, or an opposed-electrode structure (i.e., a structure in which electrodes are opposed on both sides). In the semiconductor element having the opposed-electrode structure, one of the n electrode and the p electrode is formed on the back surface of the substrate of the semiconductor element and connected to a wire in the upper-side conductive wiring 5, and the other of the n electrode and the p electrode is connected to another wire in the upper-side conductive wiring 5.

The semiconductor element 2 may be a light-receiving element or a protection element which is mounted together with a semiconductor light-emitting element. The protection element is constituted by, for example, resisters, transistors, capacitors, and the like for protection of the semiconductor light-emitting element from overvoltage. Only one, or more than one semiconductor element 2 may be mounted on the wiring substrate 3. In the case where more than one semiconductor element 2 is mounted on the wiring substrate 3, the more than one semiconductor element 2 may share the pair of wires in the upper-side conductive wiring 5 corresponding to a pair of wires of each semiconductor element 2.

In the case where the semiconductor device 1 includes an element of a fluorescent material, the semiconductor light-emitting element contains an active layer which can emit light at such a wavelength as to be able to excite the fluorescent material. Such a semiconductor light-emitting element can be constituted by, for example, gallium-nitride semiconductors. Preferably, the nitride semiconductor having the composition $In_XAl_YGa_{1-X-Y}N$ (0Y to excite the fluorescent material. Such a semiconductor light-emitting element can be constituted by, for example, gallium It is possible to choose various emission wavelengths by controlling the compositions of the semiconductor layers.

The semiconductor element 2 is an LED (light emitting diode) chip, in which a pair of positive and negative electrodes are formed on a surface in such an arrangement that the pair of positive and negative electrodes respectively face a pair of positive and negative wires in the upper-side conductive wiring 5, and the pair of positive and negative electrodes are electrically and mechanically bonded to the upper-side conductive wiring 5 with a conductive material such as gold or solder. In this case, it is possible to form in advance gold or solder bumps on the electrodes of the semiconductor element 2 by plating or physical vapor deposition. Alternatively, the bumps may be formed on the upper-side conductive wiring 5 in the wiring substrate 3, instead of the electrodes of the semiconductor element 2.

In the case where the semiconductor element 2 is a semiconductor light-emitting element, the extent of the area of the wiring substrate 3 in which the upper-side conductive wiring 5 is arranged is greater than the area (mount area) on which the semiconductor element 2 is mounted. Therefore, a filler having a white-based color, such as titanium dioxide, can be deposited by electrophoretic deposition over the area of the portion of the upper-side conductive wiring 5 arranged outside the mount area on which the semiconductor laser element is mounted. Further, in the case where the element of the fluorescent material is arranged on a surface of the semiconductor laser element, the filler is disposed on the areas other than the area on which the element of fluorescent material is arranged. Since the upper-side conductive wiring 5 is arranged over the area having greater dimensions than the outer dimensions of the semiconductor light-emitting element, heat generated by the semiconductor light-emitting element can be widely diffused, and can be satisfactorily transmitted to the back-side conductive wiring 6. Thus, it is possible to improve the dissipation performance of the heat from the semiconductor light-emitting element.

The shapes and positions of the conductive wiring arranged in the wiring substrate 3 are appropriately controlled in consideration of the dimensions and shapes of the semiconductor element 2 and the degrees of ease in arrangement of bumps and conductive wires for the semiconductor element 2.

The insulating substrate 4 is formed of, for example, glass-reinforced epoxy resin or ceramic material. In particular, in the case where high resistance to heat and irradiation is desired, it is preferable that the insulating substrate 4 be formed of ceramic material. It is preferable that one or more main ingredients of the ceramic material be selected from alumina ($Al_2O_3$), aluminum nitride (AlN), mullite, and the like. A ceramic substrate as the insulating substrate 4 is obtained by adding one or more sintering additives and the like to the one or more main ingredients, and sintering the ingredients.

For example, the insulating substrate 4 may be a ceramic substrate produced by sintering a first ingredient powder in the temperature range of 1500 to 1700° C., where the first ingredient powder contains 90 to 96 weight percent of alumina and 4 to 10 weight percent of sintering additives, and the sintering additives may include clay, talc, magnesia (MgO), calcia (CaO), silica, or the like.

Alternatively, the insulating substrate 4 may also be a ceramic substrate produced by sintering a second ingredient powder in the temperature range of 800 to 1200° C. wherein the second ingredient powder contains 40 to 60 weight percent of alumina and 60 to 40 weight percent of sintering additives, and the sintering additives may include borosilicate glass, cordierite, forsterite, mullite, or the like.

The above ceramic substrates can have various shapes in the green-sheet stage before firing. In addition, conductive wiring (and underlying layers for the conductive wiring) having variously patterned shapes can be arranged in the green-sheet stage before firing.

After the ingredients for the ceramic substrate are fired, metallic materials such as gold, silver, copper, or aluminum are deposited on the underlying layers for the conductive wiring by plating or sputtering. The outermost layer of the conductive wiring is preferably coated with a metallic material realizing high reflectance for the light from the semiconductor light-emitting element. Such a metallic material is, for example, silver or aluminum.

The thickness of the main conductive layer 20 is not specifically limited. However, in the case where the thickness of a copper film constituting the main conductive layer 20 is equal to or greater than 20 micrometers and equal to or smaller than 80 micrometers, the heat dissipation performance of the semiconductor device 1 can be improved. Therefore, it is preferable to form the copper film constituting the main conductive layer 20 to have a thickness in the above range.

In addition, as mentioned before, both of the underlying layer 10 and the main conductive layer 20 in the back-side conductive wiring 6 are assumed to contain copper. However, for the purpose of achieving satisfactory heat dissipation performance, it is sufficient that at least one of the underlying layer 10 and the main conductive layer 20 contain copper. In other words, it is sufficient that either the auxiliary conductive layer 12 or the main conductive layer 20 is constituted by Cu.

The Encapsulation member 8 is arranged on the wiring substrate 3 to cover at least the semiconductor element 2. The encapsulation member 8 is, for example, a transparent member through which the light from the semiconductor light-emitting element can transmit. Various known formation techniques such as compression molding, injection molding, or a transfer molding can be used for forming the encapsulation member 8 arranged on the wiring substrate 3.

The material constituting the encapsulation member 8 is not specifically limited, and the encapsulation member 8 can be formed of a transparent resin which is superior in weather resistance. For example, the encapsulation member 8 can be formed of one of silicone resin, epoxy resin, urea resin, and fluorine resin, or a hybrid resin containing at least one of the above resins.

The encapsulation member 8 can have various lens functions by forming the encapsulation member 8 in appropriate shapes. Specifically, the encapsulation member 8 can be formed in the shape of a convex lens or a concave lens, or in an elliptical shape in view from the plane for emission observation, or in a combination of the above shapes. In the example of FIG. 1, the encapsulation member 8 (illustrated by phantom lines) is formed in the shape of a convex lens to cover the semiconductor element 2 (which is realized by the LED) and the filler (which is disposed over the upper-side conductive wiring 5).

In the semiconductor device 1, the element of fluorescent material can be arranged on a surface of the semiconductor light-emitting element or on a surface of the upper-side conductive wiring 5. The element of fluorescent material can be formed on the (upper) surface of the wiring substrate 3 by mixing the fluorescent material with other material such as resin and depositing the mixture on the (upper) surface of the wiring substrate 3 by printing, or can be formed on the surface of the upper-side conductive wiring 5 in the wiring substrate 3 or the surface of the semiconductor light-emitting element by electrophoretic deposition.

Conventionally, Ti is used in the adhesion layer in the underlying layer for the electrode in many post-firing processes in which the underlying layer for the electrode is formed by physical vapor deposition and the electrode is formed on the underlying layer by plating. On the other hand, in the semiconductor device 1 according to the present embodiment, the adhesion layer 11 in the underlying layer 10 in each of the back-side conductive wiring 6 and the upper-side conductive wiring 5 is formed of TiW, so that the reliability of the electric connections is increased compared with the conventional techniques.

In the following explanations, the semiconductor device 1 is explained in comparison with a semiconductor device as a comparison example which is different from the semiconductor device 1 in that the adhesion layer is formed of Ti instead of TiW.

Figure 4A:
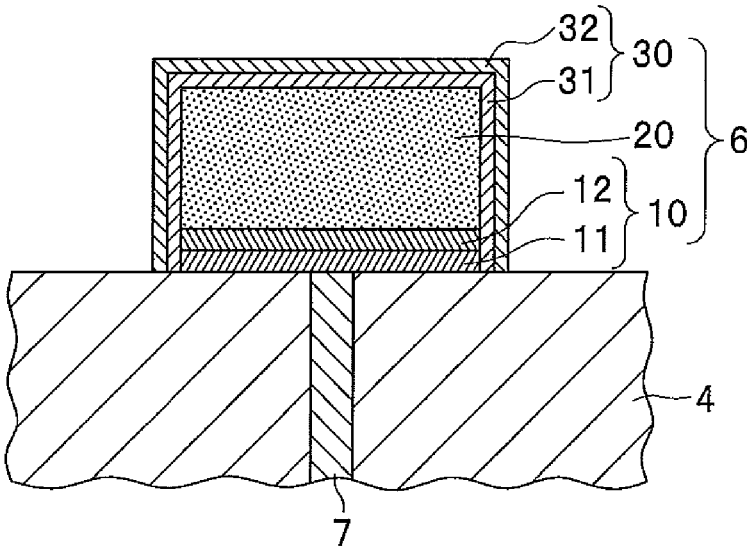
FIG. 4A is a partial cross-sectional view of the semiconductor device according to the embodiment.
Figure 4B:
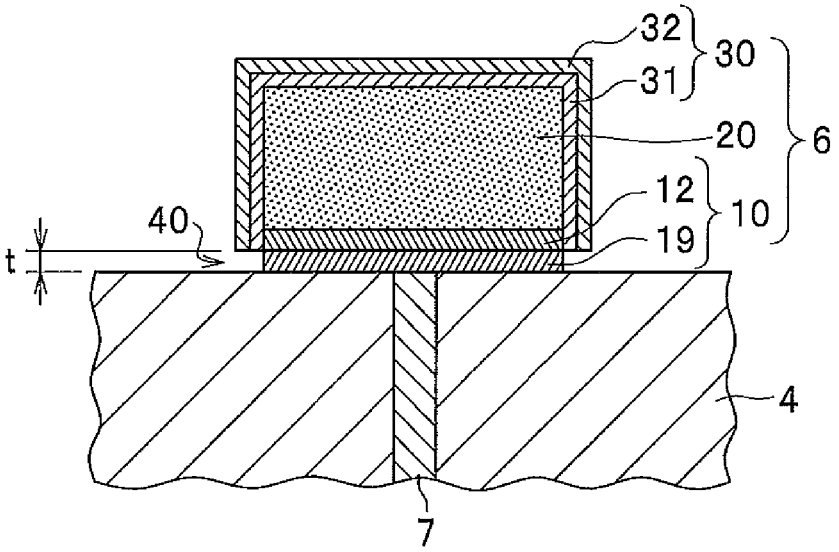
FIG. 4B is a partial cross-sectional view of a semiconductor device as a comparison example.

FIG. 4A is a partial cross-sectional view of the semiconductor device 1 according to the present embodiment, and FIG. 4B is a partial cross-sectional view of the semiconductor device as the comparison example. In the following explanations, each element constituting the semiconductor device as the comparison example which is identical or equivalent to the corresponding element in the semiconductor device 1 is referred to by the same reference number as the corresponding element in the semiconductor device 1, and identical explanations are not repeated. As mentioned before, the semiconductor device as the comparison example is different from the semiconductor device 1 in the material constituting the adhesion layer in the underlying layer 10. In the following explanations, the adhesion layer in the semiconductor device as the comparison example is referred to as the Ti film 19 by the reference number 19. In addition, the auxiliary conductive layer 12 in each semiconductor device is assumed to be formed of Cu, and is referred to as the Cu film 12.

In the case where a semiconductor device which contains the underlying layer 10 having a laminated structure of the Ti film 19 and the Cu film 12 as the semiconductor device as the comparison example illustrated in FIG. 4B is manufactured, when the platings of Ni and Au constituting the electrode layer 30 are grown after the plating of Cu for forming the main conductive layer 20, the platings of Ni and Au cannot stably adhere to the side surfaces of the Ti film 19 in the underlying layer 10 although the platings of Ni and Au can adhere to the side surfaces of the auxiliary conductive layer 12. Therefore, in the semiconductor device as the comparison example, a gap 40 can occur between the insulating substrate 4 and the platings of Ni and Au. If the semiconductor device as the comparison example is mass produced, the thickness of the Ti film 19 and the condition of the plating of the Ti film 19 vary, so that the magnitude t of the gap 40 also varies.

Figure 5A:
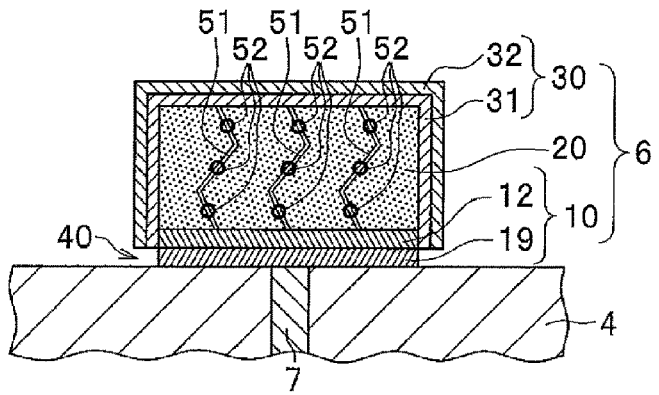
FIGS. 5A to 5D are partial cross-sectional views of the semiconductor device as the comparison example in respective stages in a process in which conductive wiring comes off.

It has been confirmed that oxygen 52 is trapped in the grain boundaries 51 during growth of the Cu plating for forming the main conductive layer 20 as schematically illustrated in FIG. 5A. The semiconductor device containing oxygen 52 as above suffers heat loads under various conditions. For example, the following three cases can be conceived. In the first case, the semiconductor device is heated during manufacture. In the second case, the semiconductor device is heated due to reflow mounting or the like when the semiconductor device is mounted as a component on an external circuit board. In the third case, when a product containing the semiconductor device as a component is used, the semiconductor device is heated, for example, by the heat of the outside air in the external environment and the heat generated by current flow.

Figure 5B:
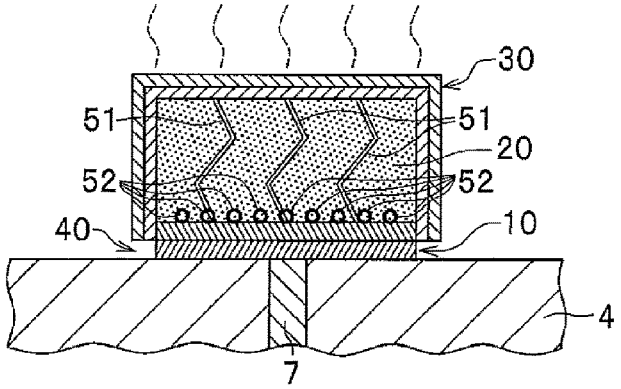
Figure 5C:
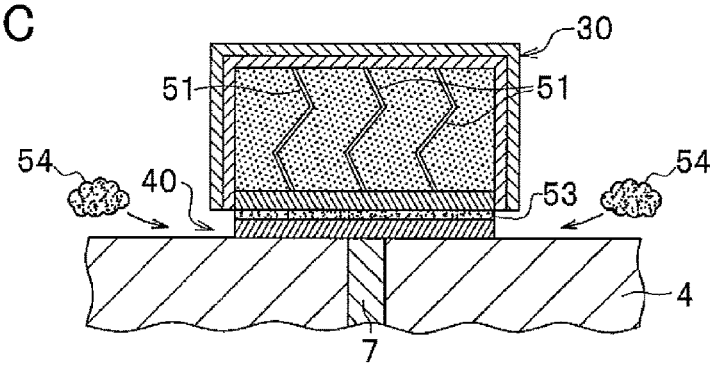

In addition, it has been confirmed that the heat load imposed on the Cu plating layer causes the following phenomenon according to the material constituting the underlying layer for the plating. That is, in the case where the underlying layer 10 has a laminated structure of the Ti film 19 and the Cu film 12 as in the semiconductor device as the comparison example, the heat load imposed on the Cu plating layer causes movement of the oxygen 52 through the grain boundaries 51 toward the underlying layer 10 as illustrated in FIG. 5B. Then, the oxygen 52 moved to the underlying layer 10 is combined with Ti at the boundary between the Cu film 12 and the Ti film 19, so that titanium oxide is produced and a film of the titanium oxide 53 is formed as illustrated in FIG. 5C. Ti is prone to oxidation, and the product of the oxidation of Ti, titanium oxide, is a stable chemical compound.

Figure 5D:
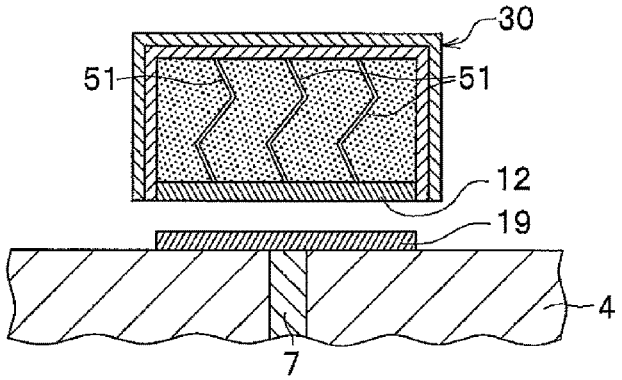

Generally the mounted circuit board, on which the semiconductor device is mounted as a component, is used in various environment conditions. In particular, in the high-temperature and high-humidity environment, water 54 is likely to filtrate into the gap 40 between the insulating substrate 4 and the plating, so that the titanium oxide film 53 becomes prone to corrosion. When the filtrating water is acid, the corrosion further advances. For example, some soldering flux used in reflow mounting of the semiconductor device is strongly acid, so that acid water 54 can filtrate into the gap 40 between the insulating substrate 4 and the plating. When the corrosion reaches the boundary between the Ti film 19 and the Cu film 12, the Ti film 19 is separated from the Cu film 12 at the boundary as illustrated in FIG. 5D, so that the electric connection is finally lost in the semiconductor device as the comparison example.

Further, when the semiconductor device as the comparison example is mass produced, the magnitude t of the gap 40 varies from device to device. Therefore, in particular, in the high-temperature and high-humidity environment, the filtrability of the water 54 into the gap 40 between the insulating substrate 4 and the plating varies from device to device. That is, the corrosion rate of the titanium oxide film 53 greatly varies, so that the time until the separation of the Ti film 19 from the Cu film 12 at the boundary greatly varies.

In contrast to the comparison example, the underlying layer 10 in the semiconductor device 1 according to the present embodiment illustrated in FIG. 4A has a laminated structure of the TiW adhesion layer 11 and the Cu film 12. Since TiW is less prone to oxidation than Ti, formation of the titanium oxide film can be suppressed even when the oxygen 52 moves through the grain boundaries 51 to the underlying layer 10 due to the heat load imposed on the Cu plating.

In addition, since the adhesion layer 11 is formed of TiW in the semiconductor device 1, the platings of Ni and Au adhere to the side surfaces of the adhesion layer 11 when the electrode layer 30 is formed. Therefore, as illustrated in FIG. 4A, no gap exists between the insulating substrate 4 and the platings of Ni and Au in the semiconductor device 1, so that water 54 does not filtrate into the underlying layer 10 even in the high-temperature and high-humidity environment. Thus, corrosion (as illustrated in FIG. 5C) of the underlying layer 10 can be prevented. Thus, exfoliation is unlikely to occur at the boundary between the TiW adhesion layer 11 and the Cu film 12. As a result, the possibility of the electric disconnection, which occurs in the comparison example as illustrated in FIG. 5D, can be minimized in the semiconductor device 1 according to the present embodiment.

Further, in the case where the semiconductor device 1 is mass produced, the variations in the corrosion rate in the underlying layer 10 is reduced since no gap exists between the insulating substrate 4 and the platings. Therefore, the reliability of the electric connections in the conductive wiring in the semiconductor device 1 is increased compared with the conventional semiconductor devices.

A process for manufacturing the wiring substrate 3 in the semiconductor device 1 according to the embodiment is explained below with reference to FIGS. 6A to 6E and 7A to 7D (and FIGS. 1 to 3 when necessary). FIGS. 6A to 6E and 7A to 7D are partial cross-sectional views of cross sections of the structures in respective steps in the process for manufacturing the wiring substrate 3 in the semiconductor device 1. In the illustrated process, the semiconductor device 1 is manufactured in plurality on a collective substrate, and each element constituting each device bears the same reference number as FIGS. 1 to 4B.

Figure 6A:
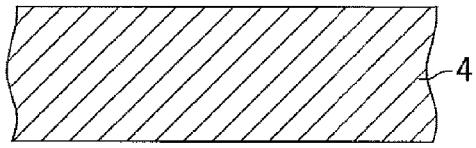
FIGS. 6A to 6E and 7A to 7D are partial cross-sectional views of cross sections corresponding to the A-A cross section indicated in FIG. 3A in respective steps in a process for manufacturing the wiring substrate used the semiconductor device according to the embodiment.

In order to manufacture the wiring substrate 3 in plurality, a large fired substrate is prepared. The fired substrate can be produced by a conventionally known manner, for example, as briefly explained below. First, a unfired ceramic green sheet is prepared. FIG. 6A illustrates an example of a green sheet for the insulating substrate 4. Although only one green sheet is illustrated, the insulating substrate 4 may be formed of a lamination of multiple green sheets.

Figure 6B:
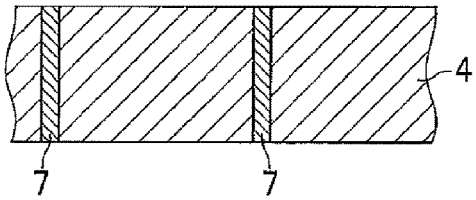

In the unfired green sheet for the ceramic substrate, necessary via holes and through holes are formed, and a paste of a metal having a high melting temperature, such as tungsten (W) or molybdenum (Mo), is applied to the principal surface of the unfired green sheet by printing, and is also applied (by printing) to the inner surfaces of the through holes by use of vacuum pumping or the like. Thereafter, the green sheet is fired, so that a wiring substrate having the vertically-through conductive wiring 7 as illustrated in FIG. 6B is obtained.

Figure 6C:
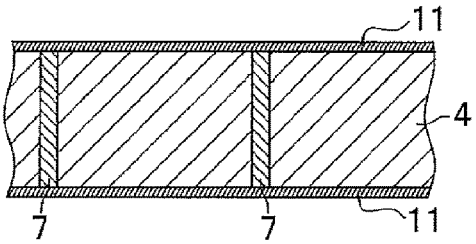
Figure 6D:
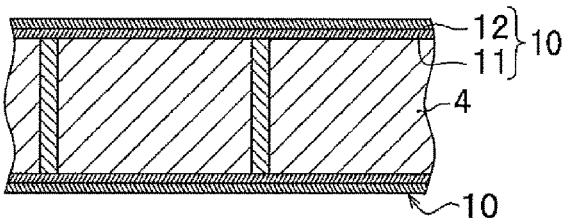

After the firing, the upper and back surfaces of the wiring substrate are coated with a TiW film (as the adhesion layer 11) having the thickness of, for example, 0.1 micrometers as illustrated in FIG. 6C by a physical vapor deposition technique such as sputtering, vacuum deposition, ion plating, or the like. Subsequently, the upper and back surfaces of the wiring substrate are coated with a Cu film (as the auxiliary conductive layer 12) having the thickness of, for example, 0.1 micrometers as illustrated in FIG. 6D by a physical vapor deposition technique such as sputtering, vacuum deposition, ion plating, or the like. Thus, the underlying layer 10 is formed.

Thereafter, a resist for protecting areas of the underlying layer 10 on which no further plating is to be formed is applied to the underlying layer 10 (which is formed as above on the upper and back surfaces of the wiring substrate) by a conventionally known technique. An example of such a technique is briefly explained below.

Figure 6E:
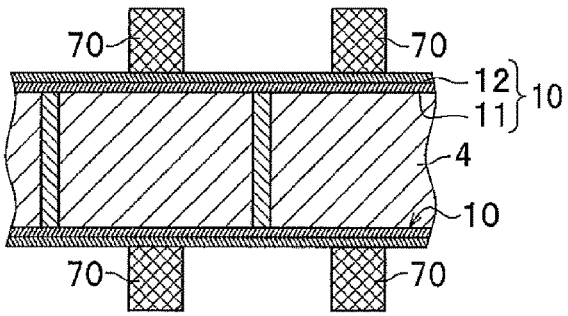

First, a DFR (dry film photoresist), which has a sheetlike form and contains a photosensitive layer, is applied to the underlying layer 10 on the upper and back surfaces of the wiring substrate. Then, a photomask in which a circuit pattern is drawn is placed on the DFR, and the portions of the DFR which are not masked by the photomask are exposed to light. Thereafter, the exposed portions of the photosensitive layer are developed by an alkali solution, and the unexposed portions of the photosensitive layer are removed. The hardened portions of the photosensitive layer can behave as resist 70 as illustrated in FIG. 6E. The portions of the underlying layer 10 masked by the resist 70 include, for example, the portions corresponding to cutting lines and the portions at which a pair of electrodes are isolated.

Figure 7A:
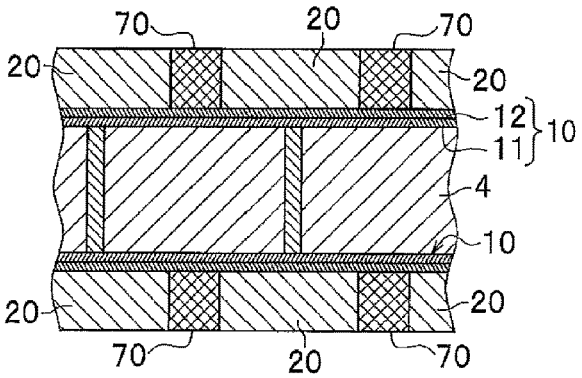

After that, the underlying layer 10 in the wiring substrate is plated with Cu in a conventionally known manner. The plating may be either electroplating or electroless plating. For example, the electroplating with Cu forms the main conductive layer 20 having the thickness of, for example, 20 to 80 micrometers on the portions of the underlying layer 10 which is not masked by the resist 70 as illustrated in FIG. 7A.

Figure 7B:
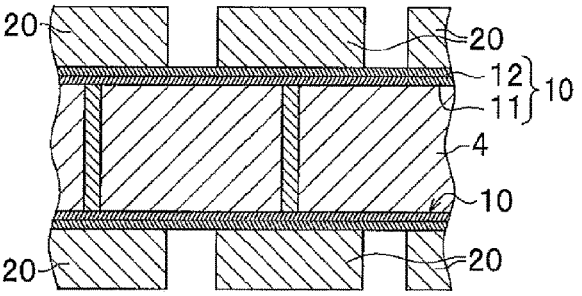

Subsequently, the resist 70 is removed by a conventionally known technique as illustrated in FIG. 7B. For example, in the wet process, the resist 70 can be removed by cleaning with a strong alkali solution, e.g., a solution of sodium hydroxide. In the dry process, the resist 70 can be removed by using a dedicated resist remover (resist asher).

Figure 7C:
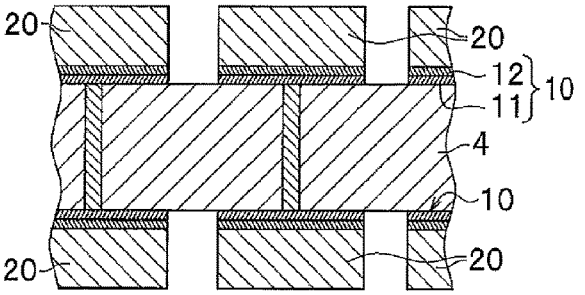

After that, the portions of the underlying layer 10 which are exposed by the above removal of the resist 70 are etched by a conventionally known technique as illustrated in FIG. 7C. For example, a resist mask is formed on the main conductive layer 20, and the exposed portions of the underlying layer 10 are dry-etched by RIE (reactive ion etching) using the resist mask, and thereafter the resist mask is removed.

Figure 7D:
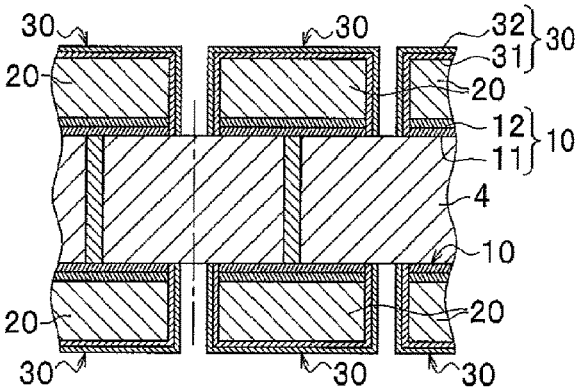

Subsequently, the electrode layer 30 constituted by platings of Ni and Au is formed on the main conductive layer 20 as illustrated in FIG. 7D. For example, the electrode layer 30 can be formed with a lamination of a Ni plating layer 31 having a thickness of 1.0 micrometers and an Au plating layer 32 having a thickness of 1.0 micrometers. Thus, the platings of Cu, Ni, and Au are formed as above on the underlying layer 10 on the upper and back surfaces of the wiring substrate.

After the above formation of the platings is completed, the collective wiring substrate is cut along the cutting line illustrated by the phantom line in FIG. 7D (in a step of cutting), so that individual wiring substrates 3 (as illustrated in FIG. 1) are obtained. Subsequently, in a step of element bonding, the semiconductor element 2 is bonded to the wiring substrate 3. Then, in a step of encapsulation, the semiconductor element 2 is encapsulated in the encapsulation member 8. Thus, the semiconductor device 1 is completed. Further, in the case where conductive wires are used, a step of wire bonding follows the step of element bonding. Alternatively, the step of cutting may be performed after the step of element bonding or the step of encapsulation.

In the semiconductor device 1 according to the present embodiment, the side surfaces of the adhesion layer 11, the side surfaces of the auxiliary conductive layer 12, and the side surfaces and the upper surface of the main conductive layer 20 in the upper-side conductive wiring 5 and the back-side conductive wiring 6 are coated with the electrode layer 30. Therefore, no gap occurs between the insulating substrate 4 and the electrode layer 30, so that the electrode layer 30 has the function of a protection film for the side surfaces of the adhesion layer 11. In addition, even when oxygen 52 inside the main conductive layer 20 moves to the adhesion layer 11 due to heat loads imposed on the semiconductor device, TiW constituting the adhesion layer 11 is resistant to oxidation and corrosion. Therefore, even when the semiconductor device 1 is used in the high-temperature and high-humidity environment for a long time, the reliability of the electric connections in the conductive wiring is improved even after use of the semiconductor device 1 in the high-temperature and high-humidity environment for a long time. Further, since the wiring substrate 3 in the semiconductor device 1 can be manufactured by the post-fire process, it is possible to achieve satisfactory precision in patterning for the wiring in the manufacture of the wiring substrate 3 in plurality on a large collective substrate.

The embodiment explained above is an example used for concretely explaining the technical concept and idea of the embodiment, and the scope of the embodiment is not limited to the explained embodiment. Specifically, each of the constituent elements and members described in the appended claims should never be limited to the corresponding element or member in the explained embodiment. In addition, the scope of the embodiment is not limited to the dimensions, the compositions of the constituent materials, shapes, and relative positions described in the embodiment unless otherwise specified. The dimensions, the compositions of the constituent materials, shapes, and relative positions indicated in the explanations on the embodiment are merely examples. Further, the functions of more than one constituent element of the semiconductor device according to the embodiment may be realized by one element or member, or the functions of one constituent element of the semiconductor device according to the embodiment may be divided among more than one element or member.

Specifically, the following examples (1) to (6) of variations are included within the scope of the embodiment.

(1) Although, in the explained embodiment, the main conductive layer 20 is formed of Cu and the underlying layer 10 is constituted by the TiW adhesion layer 11 and the Cu auxiliary conductive layer 12, for example, the main conductive layer 20 may be formed of Ni, and the auxiliary conductive layer 12 (which, together with the TiW adhesion layer 11, constitutes the underlying layer 10) may also be formed of Ni.

(2) In addition, the auxiliary conductive layer 12 in the underlying layer 10 may be formed in multiple layers.

(3) Further, it is possible to form an additional layer of a different material (e.g., palladium (Pd) or TiPd) between the adhesion layer 11 and the auxiliary conductive layer 12 in the underlying layer 10.

Figure 3B:
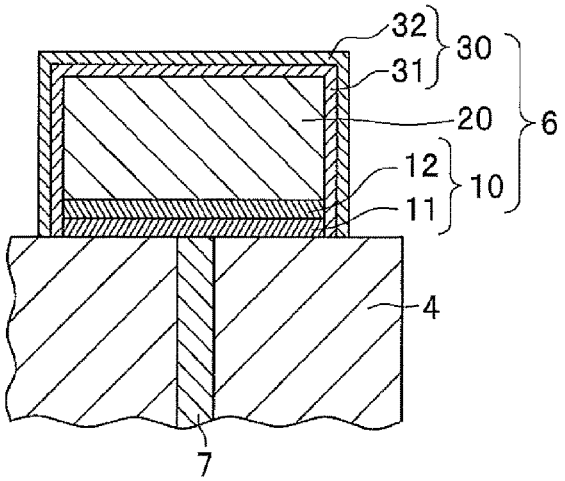
FIG. 3B is a partial cross-sectional view of the semiconductor device according to the embodiment schematically illustrating the A-A cross section indicated in FIG. 3A.

(4) Although, in the structure illustrated in FIG. 3B, the position at which the electrode layer 30 is in contact with the insulating substrate 4 is apart from the vertically-through conductive wiring 7, the wiring substrate 3 may be formed in such a manner that the electrode layer 30 is in contact with the vertically-through conductive wiring 7.

(5) Although, in the explained embodiment, the electrode layer 30 contains the platings of Ni and Au, alternatively, the electrode layer 30 may be formed to contain one of Ni and Au.

(6) Although, in the explained embodiment, the adhesion layer 11 is formed of TiW, alternatively, the adhesion layer 11 may be formed of TiMo. Even in this case, similar advantages can be achieved.

According to the embodiment, it is possible to increase the reliability of the electric connections in a semiconductor device including a semiconductor element and a wiring substrate on which the semiconductor element is mounted.

The semiconductor device according to the embodiment can be used in various systems in which semiconductor light-emitting elements are mounted. Specifically, the semiconductor device according to the embodiment can be used in various lighting devices including: the lighting devices in the image readers in facsimile systems, copiers, handy scanners, and the like; and the lighting devices in flashlights, light sources for illumination, backlights in LED displays and mobile phones, traffic signals, illuminated switches, stop lamps mounted on automobiles, various sensors, various indicators, and the like.

What is claimed is:

1. A semiconductor device comprising:

a semiconductor element; and a wiring substrate on which the semiconductor element is mounted, wherein the wiring substrate includes, an insulating substrate, [and]

a conductive wiring disposed in the insulating substrate and electrically connected to the semiconductor element, *and*

*a vertically-through conductive wiring disposed inside the insulating substrate, the vertically-through conductive wiring extending through an entire thickness direction of the insulating substrate*;

the conductive wiring includes, an underlying layer disposed on the insulating substrate, a main conductive layer formed on the underlying layer, and an electrode layer covering side surfaces of the underlying layer and side surfaces and an upper surface of the main conductive layer, wherein the underlying layer includes an adhesion layer in contact with the insulating substrate, *and an auxiliary conductive layer, wherein* the adhesion layer contains an alloy of one of W and Mo, and wherein the alloy contains Ti,

*wherein the main conductive layer and the auxiliary conductive layer contain copper metal,*

*wherein the main conductive layer is in direct contact with an upper surface of the auxiliary conductive layer, and a bottom surface of the auxiliary conductive layer that*

*is opposite the upper surface of the auxiliary conductive layer is in direct contact with an upper surface of the adhesion layer,*

*wherein the electrode layer comprises a first plating layer and a second plating layer,*

*wherein the first plating layer and the second plating layer cover the side surfaces of the underlying layer, and the side surfaces and the upper surface of the main conductive layer,*

*wherein one side of the first plating layer is in direct contact with the side surfaces of the underlying layer and the side surfaces of the main conductive layer,*

*wherein one side of the adhesion layer directly covers an end of the vertically-through conductive wiring,*

*wherein the semiconductor element is a semiconductor light-emitting element,*

*wherein an area of the conductive wiring disposed on an upper side surface of the insulating substrate is greater than a mount area on which the semiconductor light-emitting element is mounted, and*

*wherein a filler having a white-based color is disposed by electrophoretic deposition over a portion of the conductive wiring disposed on the upper side surface of the insulating substrate, the portion being arranged outside the mount area.*

[2. The semiconductor device according to claim 1, wherein the underlying layer further includes an auxiliary conductive layer in contact with the main conductive layer.]

[3. The semiconductor device according to claim 2, wherein at least one of the main conductive layer and the auxiliary conductive layer comprises Cu.]

4. The semiconductor device according to claim [2] *1*, wherein the main conductive layer has a thickness greater than a thickness of the auxiliary conductive layer.

5. The semiconductor device according to claim 4, wherein the thickness of the main conductive layer is 20 to 80 micrometers.

6. The semiconductor device according to claim 4, wherein the thickness of the auxiliary conductive layer is 0.1 to 3 micrometers.

[7. The semiconductor device according to claim 1, wherein the main conductive layer comprises Cu.]

8. The semiconductor device according to claim 1, wherein the electrode layer contains Ni or Au.

9. The semiconductor device according to claim 1, wherein the adhesion layer comprises an alloy containing 1 to 30 weight percent of Ti, the alloy including W.

10. A semiconductor device, comprising:

a semiconductor element; and a wiring substrate on which the semiconductor element is mounted, wherein the wiring substrate includes an insulating substrate, an upper-side conductive wiring disposed on a surface on a first side of the insulating substrate and electrically connected to the semiconductor element, a back-side conductive wiring disposed on a surface on a second side of the insulating substrate, and a vertically-through conductive wiring which is disposed inside the insulating substrate and electrically connects the upper-side conductive wiring and the back-side conductive wiring, *the vertically-through conductive wiring further extending through an entire thickness direction of the insulating substrate*;

wherein each of the upper-side conductive wiring and the back-side conductive wiring includes, an underlying layer disposed on the insulating substrate, a main conductive layer disposed on the underlying layer [and containing a conductive metal], and an electrode layer disposed on an area extending from an upper surface of the main conductive layer to a surface of the insulating substrate to cover side surfaces and an upper surface of the main conductive layer and side surfaces of the underlying layer; and wherein the underlying layer includes[,] an adhesion layer in contact with the insulating substrate, the adhesion layer including TiW, and *includes* an auxiliary conductive layer being formed in contact with the main conductive layer [and containing the conductive metal],

*wherein the main conductive layer and the auxiliary conductive layer contain copper metal,*

*wherein the main conductive layer is in direct contact with an upper surface of the auxiliary conductive layer, and a bottom surface of the auxiliary conductive layer that is opposite the upper surface of the auxiliary conductive layer is in direct contact with an upper surface of the adhesion layer,*

*wherein the electrode layer comprises a first plating layer and a second plating layer,*

*wherein the first plating layer and the second plating layer cover the side surfaces of the underlying layer, and the side surfaces and the upper surface of the main conductive layer,*

*wherein one side of the first plating layer is in direct contact with the side surfaces of the underlying layer and the side surfaces of the main conductive layer,*

*wherein one side of the adhesion layer directly covers an end of the vertically-through conductive wiring, and*

*wherein the semiconductor element is a semiconductor light-emitting element,*

*wherein an area of the conductive wiring disposed on an upper side surface of the insulating substrate is greater than a mount area on which the semiconductor light-emitting element is mounted, and*

*wherein a filler having a white-based color is disposed by electrophoretic deposition over a portion of the conductive wiring disposed on the upper side surface of the insulating substrate, the portion being arranged outside the mount area.*

[11. The semiconductor device according to claim 10, wherein the conductive metal comprises Cu.]

12. The semiconductor device according to claim 10, wherein the electrode layer comprises Ni and Au.

13. The semiconductor device according to claim 10, wherein TiW contained in the adhesion layer comprises 1 to 30 weight percent of Ti.

14. A semiconductor device [including] *comprising:* a semiconductor element*;* and a wiring substrate on which the semiconductor element is mounted, wherein[:] the wiring substrate includes, an insulating substrate, [and]

a conductive wiring disposed in the insulating substrate and electrically connected to the semiconductor element*, and*

*a vertically-through conductive wiring disposed inside the insulating substrate, the vertically-through conductive wiring extending through an entire thickness direction of the insulating substrate*;

the conductive wiring includes, an underlying layer disposed on the insulating substrate, a main conductive layer disposed on the underlying layer, and an electrode layer covering side surfaces of the underlying layer and side surfaces and an upper surface of the main conductive layer; [and]

wherein the underlying layer includes an adhesion layer in contact with the insulating substrate and containing an alloy of Ti, *and includes an auxiliary conductive layer,*

*wherein the main conductive layer and the auxiliary conductive layer contain copper metal,*

*wherein the main conductive layer is in direct contact with an upper surface of the auxiliary conductive layer, and a bottom surface of the auxiliary conductive layer that is opposite the upper surface of the auxiliary conductive layer is in direct contact with an upper surface of the adhesion layer,*

*wherein the electrode layer comprises a first plating layer and a second plating layer,*

*wherein the first plating layer and the second plating layer cover the side surfaces of the underlying layer, and the side surfaces and the upper surface of the main conductive layer,*

*wherein one side of the first plating layer is in direct contact with the side surfaces of the underlying layer and the side surfaces of the main conductive layer,*

*wherein one side of the adhesion layer directly covers an end of the vertically-through conductive wiring, and*

*wherein the semiconductor element is a semiconductor light-emitting element,*

*wherein an area of the conductive wiring disposed on an upper side surface of the insulating substrate is greater than a mount area on which the semiconductor light-emitting element is mounted, and*

*wherein a filler having a white-based color is disposed by electrophoretic deposition over a portion of the conductive wiring disposed on the upper side surface of the insulating substrate, the portion being arranged outside the mount area.*

15. The semiconductor device according to claim 14, wherein the alloy of Ti contains a group 6 transition metal element as a main component.

[16. A semiconductor device, comprising:

semiconductor means for responding to electrical signals input thereto;

wiring means for conducting the electrical signals to and from the semiconductor means, wherein the wiring means includes insulating means for providing an insulating surface and for supporting the semiconductor means thereupon, and conductive wiring means disposed in the insulating means for being electrically connected to the semiconductor means, the conductive wiring means including underlying means formed on the insulating means, main conductive means disposed on the underlying means, and electrode means covering side surfaces of the underlying means and side surfaces and an upper surface of the main conductive means, wherein the underlying means includes adhesion means for contacting the insulating means, wherein the adhesion means contains an alloy of one of W and Mo, and wherein the alloy contains Ti.]

[17. A semiconductor device, comprising:

semiconductor means for responding to electrical signals input thereto;

wiring means for supporting the semiconductor means, wherein the wiring means includes an insulating means, upper-side conductive wiring means formed on a surface on a first side of the insulating means, for being electrically connected to the semiconductor means, back-side conductive wiring means formed on a surface on a second side of the insulating substrate, and vertically-through conductive wiring means disposed inside the insulating means for electrically connecting the upper-side conductive wiring means and the back-side conductive wiring means, wherein each of the upper-side conductive wiring means and the back-side conductive wiring means includes underlying means formed on the insulating substrate, and main conductive means formed on the underlying means and containing a conductive metal, and electrode means formed on an area extending from an upper surface of the main conductive means to a surface of the insulating means for covering side surfaces and an upper surface of the main conductive means and side surfaces of the underlying means, adhesion means in contact with the insulating means, the adhesion means including TiW, and auxiliary conductive means in contact with the main conductive means, and containing the conductive metal.]

*18. The semiconductor device according to claim 14, wherein the adhesion layer comprises a material containing an alloy of Mo, the alloy containing Ti.*

*19. The semiconductor device according to claim 1,*

*wherein one side of the adhesion layer of the conductive wiring disposed on a surface on a first side of the insulating substrate directly covers an end of the vertically-through conductive wiring, and*

*wherein one side of another adhesion layer of the conductive wiring disposed on a surface on a second side of the insulating substrate directly covers another end of the vertically-through conductive wiring.*

* * * * *